(12) United States Patent
Shibasaki et al.

(10) Patent No.: US 7,878,670 B2
(45) Date of Patent: Feb. 1, 2011

(54) ILLUMINATION APPARATUS AND LIQUID CRYSTAL DISPLAY APPARATUS

(75) Inventors: Toshinari Shibasaki, Ibaraki (JP);
Katsusuke Shimazaki, Ibaraki (JP);
Sukekazu Aratani, Hitachi (JP);
Tatsuya Sugita, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 217 days.

(21) Appl. No.: 12/230,581

(22) Filed: Sep. 2, 2008

(65) Prior Publication Data

US 2009/0073691 A1 Mar. 19, 2009

(30) Foreign Application Priority Data

Sep. 13, 2007 (JP) ............................. 2007-237925

(51) Int. Cl.
*G09F 13/08* (2006.01)
*F21V 5/04* (2006.01)
(52) U.S. Cl. .................. 362/84; 362/97.2; 362/331; 349/62; 349/69
(58) Field of Classification Search .................. 362/84, 362/561, 97.1–97.3, 224, 225, 237, 330–338, 362/606, 607; 349/62, 63, 64, 69, 70; 313/498, 313/506
See application file for complete search history.

(56) References Cited

U.S. PATENT DOCUMENTS 5,408,395 A * 4/1995 Schmid et al. .............. 362/240
6,791,639 B2 9/2004 Colgan et al.
7,726,865 B2 * 6/2010 Sato et al. .................. 362/620
2006/0285312 A1 * 12/2006 Ogawa et al. ................ 362/97
2007/0030676 A1 * 2/2007 Ichihara ..................... 362/244
2009/0284954 A1 * 11/2009 Yamada et al. ............. 362/97.2

FOREIGN PATENT DOCUMENTS

| JP | 2003-59641 A | 2/2003 |
|---|---|---|
| JP | 2003-330007 A | 11/2003 |
| JP | 2006-318807 A | 11/2006 |

\* cited by examiner

*Primary Examiner*—Bao Q Truong
(74) *Attorney, Agent, or Firm*—Birch, Stewart, Kolasch & Birch, LLP

(57) ABSTRACT

Provided is an illumination apparatus for a liquid crystal display apparatus having a plurality of transmission parts arranged two-dimensionally, having a plurality of aspherical lenses, which is installed in response to each of a plurality of the transmission parts and concentrates light for each of a plurality of the transmission parts; a plurality of light emission parts R1 installed in response to each focal point position of a plurality of the aspherical lenses; and an electroluminescence layer containing a non-light emission region R2 installed between a plurality of the light emission parts R1 themselves. Each of a plurality of the aspherical lenses has an inner side lens face containing an intersection with an optical axis AX, and an outer side lens face enclosing said inner side lens face, and curvature in the outer side lens face is smaller than curvature in the inner side lens face.

7 Claims, 9 Drawing Sheets

ILLUMINATION APPARATUS AND LIQUID CRYSTAL DISPLAY APPARATUS

INCORPORATION BY REFERENCE

The present application claims priority from Japanese application JP-2007-237925 filed on Sep. 13, 2007, the content of which is hereby incorporated by reference into this application.

BACKGROUND OF THE INVENTION

The present invention relates to an illumination apparatus and a liquid crystal display apparatus. In particular, the present invention relates to an illumination apparatus suitable to a semi-transmissive liquid crystal display apparatus, and a semi-transmissive liquid crystal display apparatus incorporated with this illumination apparatus.

In recent years, technological progress relating to the liquid crystal display apparatus has been significant. The liquid crystal display apparatus is incorporated also into a mobile phone, a portable personal computer etc., in addition to stationary display. Accordingly, in addition to higher performance of the liquid crystal display apparatus, compact sizing of the liquid crystal display apparatus itself has also been desired strongly. In particular, with accompanying the desire for thinner type of the liquid crystal display apparatus, thinner type of a back light part itself, which functions as a light A source of the liquid crystal display apparatus, has also been desired strongly.

As the back light part of the liquid crystal display apparatus, there has known conventionally an LED (Light Emitting Diode) or a system for guiding outgoing light from a cold-cathode tube to a liquid crystal panel part via a light guide plate (for example, refer to JP-A-2003-330007). However, in order to make uniform intensity distribution of outgoing light from the light guide plate, it is necessary to secure a certain thickness of the light guide plate, which makes difficult to achieve sufficient thinning of the back light part.

On the other hand, there has also been developed technology aiming at thinning of the back light part by utilization of an organic electroluminescence (hereafter, organic EL (organic electroluminescence)) (refer to JP-A-2003-59641, JP-A-2006-318807). However, because the directivity of the light emitted from a light emitting part of the organic EL is low, enhancement of light utilization efficiency in a display apparatus is inhibited, by which higher brightness or power saving of the liquid crystal display apparatus cannot be achieved.

In view of this point, in JP-A-2003-59641, a micro lens array element is arranged on the upper part electrode, which is present on a light emission layer. In JP-A-2006-318807, a micro lens array is arranged on the upper part electrode, which is present on a light emission layer

SUMMARY OF THE INVENTION

It should be noted that, even when a spherical lens is simply arranged on the organic EL, as described in JP-A-2006-318807, sufficient enhancement of light utilization efficiency cannot be achieved, in particular, in semi-transmissive liquid crystal display apparatus. It is because, in a spherical lens, it is difficult for focal point position of a lens face at the vicinity of the optical axis thereof, to coincide with focal point position of a lens face apart from the optical axis thereof. In particular, in semi-transmissive liquid crystal display apparatus incorporated with a back light part, which utilizes the organic EL having low directivity of outgoing light (generated light is radiated in every direction), it is required to suppress as much as possible the deterioration of light utilization efficiency as the whole apparatus, caused by optical loss after passing through a lens.

The present invention has been made to solve such a problem, and it is an object of the present invention to make possible suppression of lowering of light utilization efficiency of the liquid crystal display apparatus, caused by optical loss after passing through a lens, and enhance light utilization efficiency of the liquid crystal display apparatus, in relation to the back light part (an illumination apparatus) of the liquid crystal display apparatus which utilizes EL.

An illumination apparatus relevant to the present invention is an illumination apparatus for a liquid crystal display apparatus having a plurality of transmission parts arranged two-dimensionally, having: a plurality of aspherical lenses, which is installed in response to each of a plurality of the transmission parts and concentrates light for each of a plurality of the transmission parts; a plurality of light emission parts installed in response to each focal point position of a plurality of the aspherical lenses; and an electroluminescence layer containing a non-light emission region installed between a plurality of the light emission parts themselves, wherein each of a plurality of the aspherical lenses has an inner side lens face containing an intersection with an optical axis of the aspherical lenses, and an outer side lens face enclosing the inner side lens face, and curvature in the outer side lens face is smaller than curvature in the inner side lens face.

The aspherical lenses have an inner side lens face containing an intersection with an optical axis of the aspherical lenses, and an outer side lens face enclosing the inner side lens face. And, it is designed that curvature in the outer side lens face of the aspherical lenses is smaller than curvature in the inner side lens face of the aspherical lenses. In this way, the light generated in the light emission region is effectively concentrated for a transmission part contained in the liquid crystal display apparatus via an aspherical lens, and light utilization efficiency of the liquid crystal display apparatus is enhanced.

It is preferable that a cross-sectional view shape of each of a plurality of the aspherical lenses is a convex shape.

It is preferable that each of a plurality of the aspherical lenses is divided to a circular body having the intersection at a lens face, and a ring-like body enclosing the circular body, based on a division line in response to a top view shape of the aspherical lens. In this way, thickness of the aspherical lens itself can be made thinner, and a thin-type illumination apparatus can be achieved.

It is preferable that the outer side lens face is contained at least in a lens face of the ring-like body. It is preferable that the outer side lens face is contained at least in a lens face of the circular body. It is preferable that the outer side lens face is contained in a lens face of the circular body, as well as also in a lens face of the ring-like body.

It is preferable that a cross-sectional view shape of the circular body is a convex shape, and a cross-sectional view shape of the ring-like body is a convex shape.

It is preferable that the cross-sectional view shape of the aspherical lens is represented by the expression 1:

$$z = \frac{cr^2}{1 + \sqrt{1-(1+k)c^2r^2}} \quad \text{(Expression 1)}$$

wherein k represents constant in a range of −1.4<k<0;
z represents height of a lens face at an arbitrary point;
c represents curvature of a lens at the vicinity of the apex; and
r represents coordinate at an arbitrary point.

It is preferable that the electroluminescence layer is sandwiched by a pair of electrode layers, the non-light emission region corresponds to a formation region of an insulation layer formed between the electrode layer and the electroluminescence layer, and the light emission region corresponds to a region where the electrode layer is exposed from the insulation layer.

A liquid crystal display apparatus relevant to the present invention is a liquid crystal display apparatus having: a liquid crystal layer sandwiched between a pair of transparent substrates; a wiring layer having a plurality of transmission parts arranged two-dimensionally; and an illumination apparatus emitting the incident light entered to the liquid crystal layer via the transmission part, wherein the illumination apparatus having: a plurality of aspherical lenses, which is installed in response to each of a plurality of the transmission parts and concentrates the light for each of a plurality of the transmission parts; a plurality of light emission parts installed in response to each focal point position of a plurality of the aspherical lenses; and an electroluminescence layer containing a non-light emission region installed between a plurality of the light emission parts themselves, wherein each of a plurality of the aspherical lenses has an inner side lens face containing an intersection with an optical axis of the aspherical lenses, and an outer side lens face enclosing the inner side lens face, and curvature in the outer side lens face is smaller than curvature in the inner side lens face.

The aspherical lenses have an inner side lens face containing an intersection with an optical axis of the aspherical lenses, and an outer side lens face enclosing the inner side lens face. And, it is designed that curvature in the outer side lens face of the aspherical lenses is smaller than curvature in the inner side lens face of the aspherical lenses. In this way, the light generated in the light emission region is effectively concentrated for a transmission part contained in the liquid crystal display apparatus via an aspherical lens, and light utilization efficiency of the liquid crystal display apparatus is enhanced.

It is preferable that each of a plurality of the aspherical lenses is divided to a circular body having the intersection at a lens face, and a ring-like body enclosing the circular body, based on a division line resembling to a top view shape of the aspherical lens.

It is an object of the present invention to make possible suppression of lowering of light utilization efficiency of the liquid crystal display apparatus, caused by optical loss after passing through a lens, and enhance light utilization efficiency of the liquid crystal display apparatus, in relation to the back light part (an illumination apparatus) of the liquid crystal display apparatus which utilizes the organic EL.

Other objects, features and advantages of the invention will become apparent from the following description of the embodiments of the invention taken into conjunction with the accompanying drawings.

DETAILED DESCRIPTION OF THE INVENTION

Figure 1:
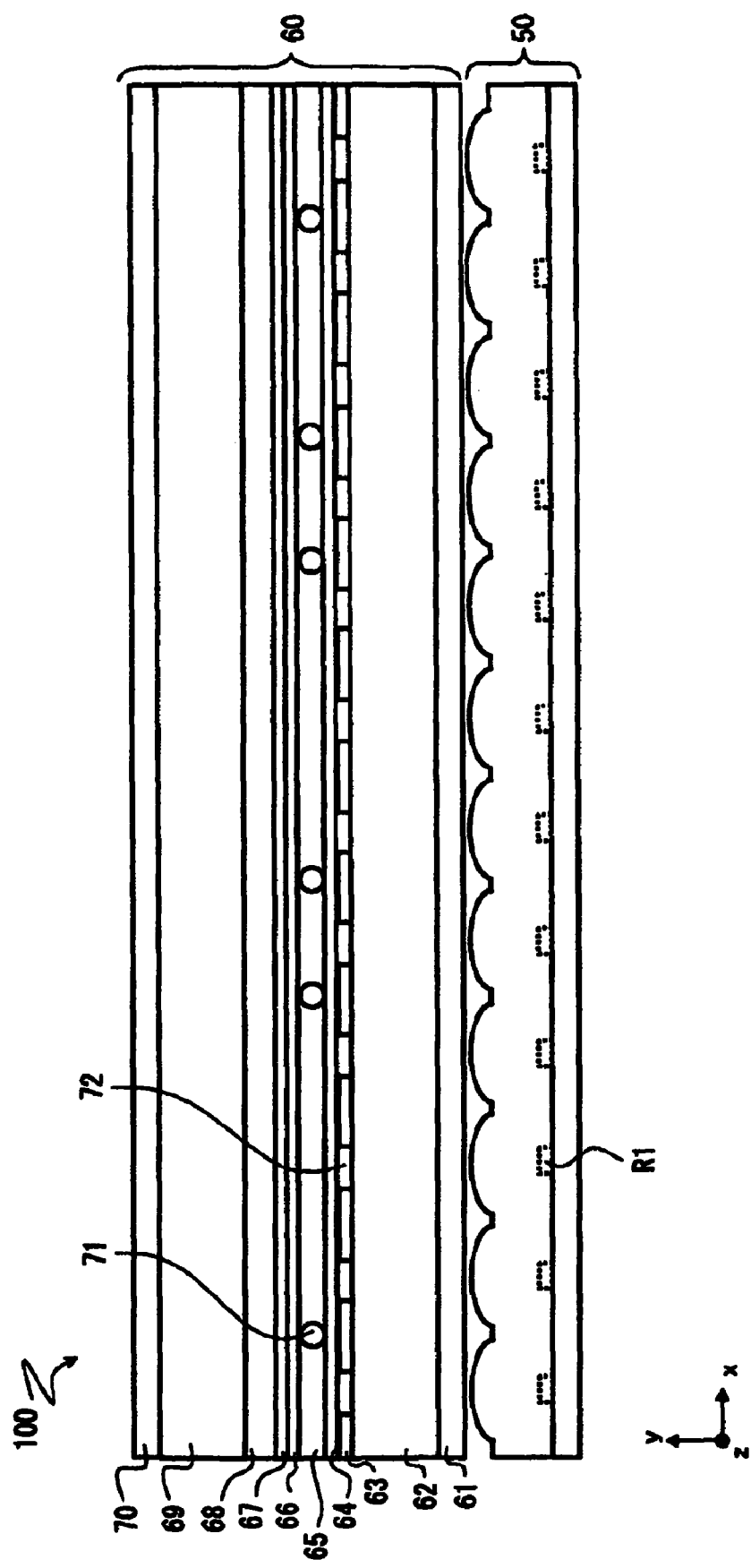
FIG. 1 is a schematic exemplary diagram for explaining a laminated structure of a semi-transmissive liquid crystal display apparatus.

Explanation will be given below on embodiments of the present invention with reference to drawings. It should be noted that each embodiment is simplified for explanation convenience. Because drawings are simplified ones, technical scope of the present invention should not be construed narrowly based on description of the drawings. These drawings are only for explaining purpose of technological items, and correct size or the like of elements shown in the drawings are not reflected. The same code is attached to the same element, and duplicated explanation shall be omitted. Wordings showing direction such as up, down, left and right shall be used on the premise of front viewing of the drawings.

First Embodiment

Explanation will be given below on a first embodiment of the present invention with reference to FIG. 1 to FIG. 8E.

Figure 2:
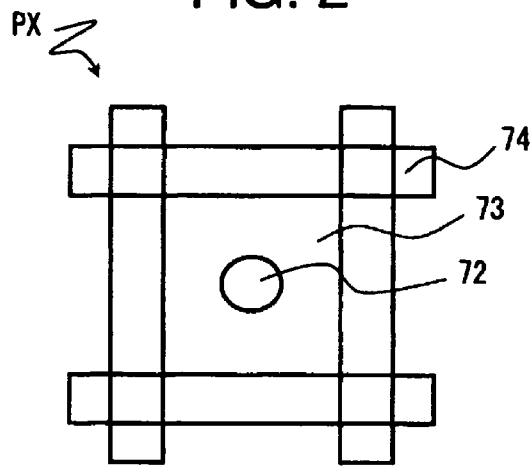
FIG. 2 is a schematic exemplary diagram for explaining a top view configuration of a wiring layer.
Figure 3:
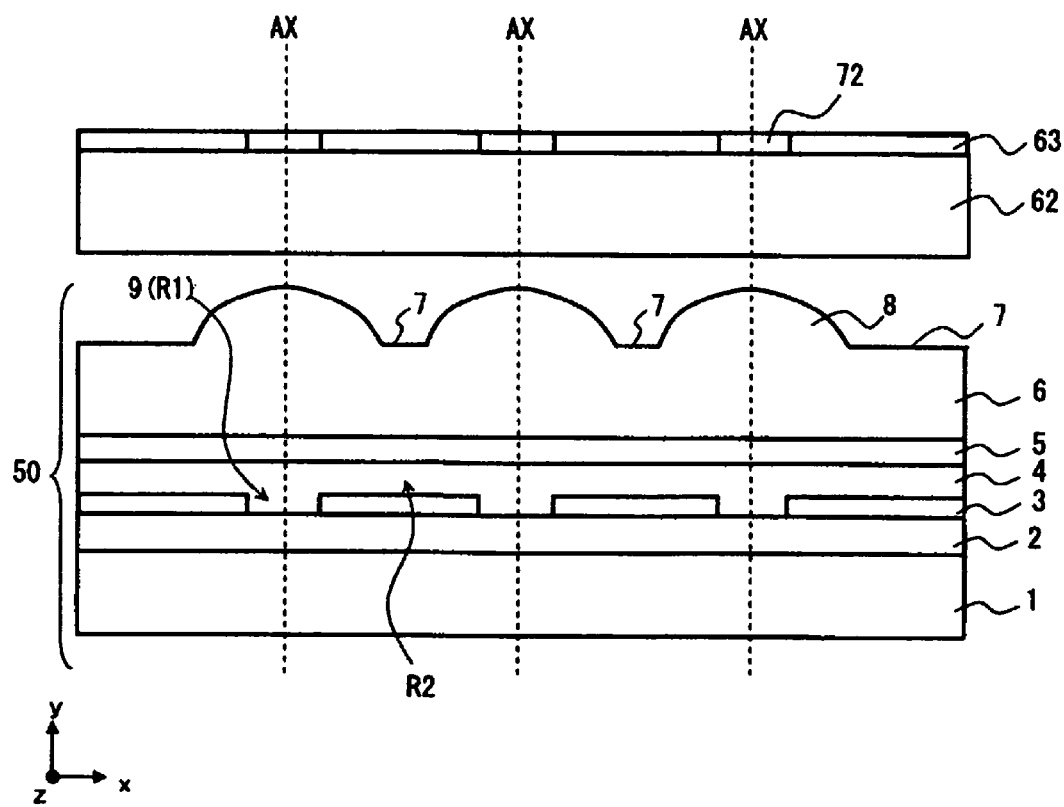
FIG. 3 is a schematic exemplary diagram for explaining a laminated structure of a back light unit.
Figure 4:
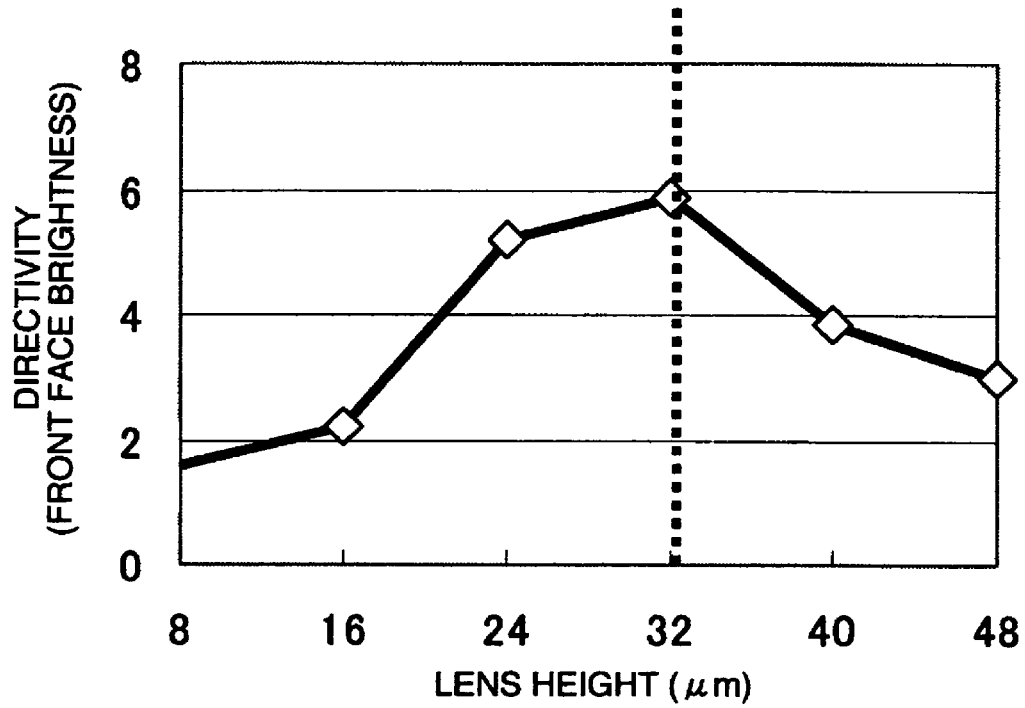
FIG. 4 is a chart for explaining relation between lens height and directivity.
Figure 5:
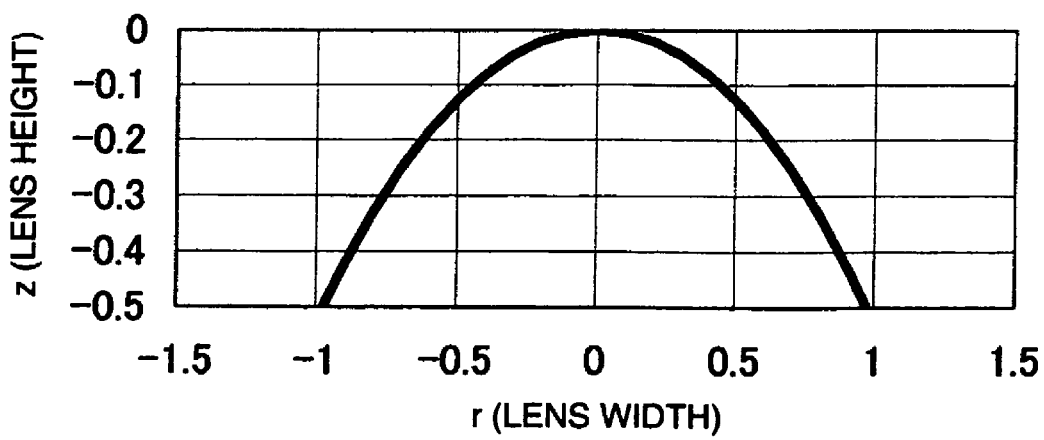
FIG. 5 is a schematic diagram for explaining a lens configuration (a cross-sectional view shape).
Figure 6:
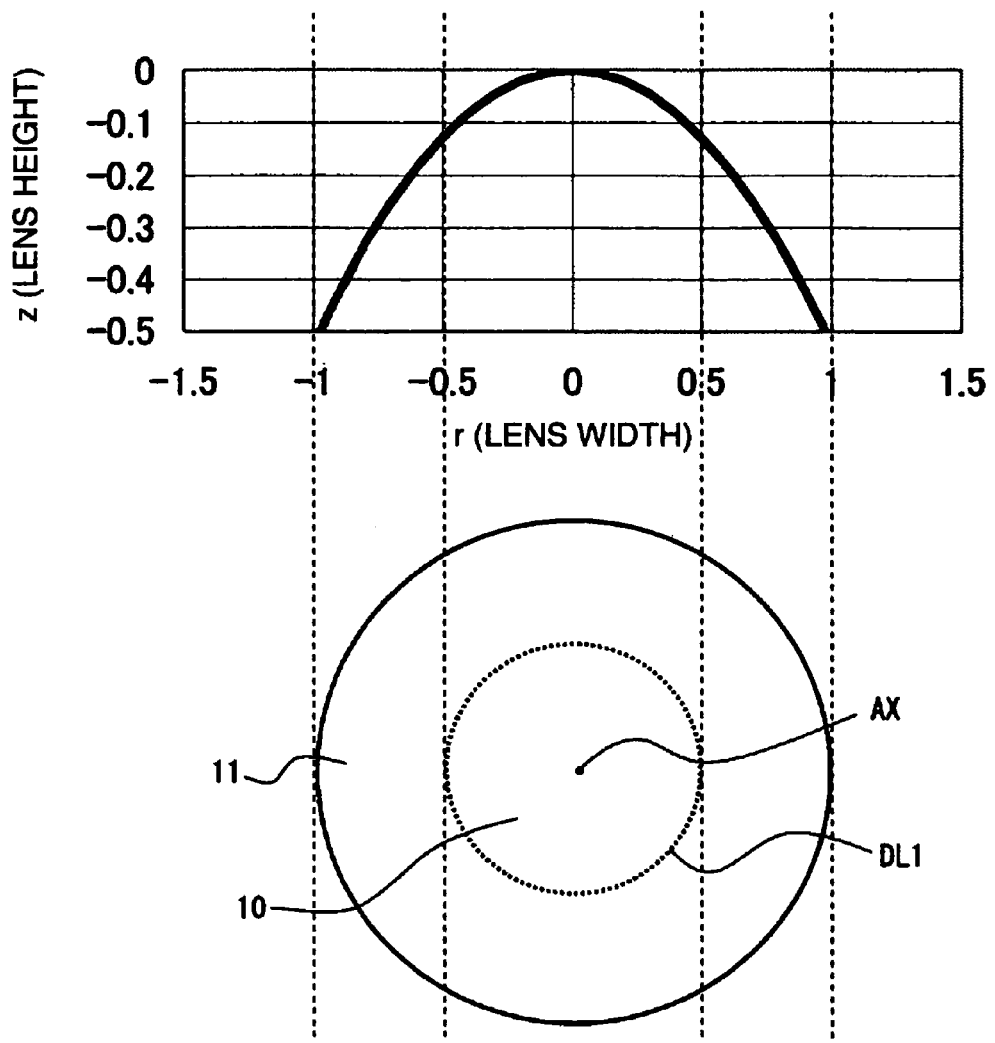
FIG. 6 is a schematic diagram for explaining a lens configuration (a cross-sectional view shape, a top view shape).
Figure 7:
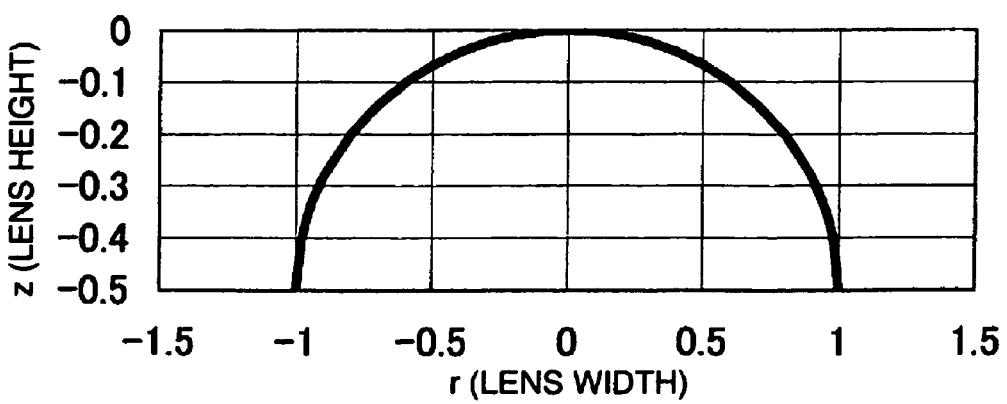
FIG. 7 is a schematic diagram for explaining a configuration of a spherical lens (a cross-sectional view shape).

FIG. 1 is a schematic exemplary diagram for explaining a laminated structure of a semi-transmissive liquid crystal display apparatus. FIG. 2 is a schematic exemplary diagram for explaining a top view configuration of a wiring layer. FIG. 3 is a schematic exemplary diagram for explaining a laminated structure of a back light unit. FIG. 4 is a chart for explaining relation between lens height and directivity. FIG. 5 is a schematic diagram for explaining a lens configuration (a cross-sectional view shape). FIG. 6 is a schematic diagram for explaining a lens configuration (a cross-sectional view shape, a top view shape). FIG. 7 is a schematic diagram for explaining a configuration of a spherical lens (a cross-sectional view shape). FIGS. 8A to 8E are charts for explaining a method for producing a back light unit.

As shown in FIG. 1, a semi-transmissive liquid crystal display apparatus 100 has a back light unit (an illumination apparatus) 50, and a liquid crystal panel part 60, in this order. Explanation will be given on the configuration of the back light unit 50 with reference to FIG. 3.

As shown in FIG. 1, the liquid crystal panel part 60 has a polarization layer 61, a lower part substrate 62, a lower part wiring layer 63, an oriented film 64, a liquid crystal layer 65, an oriented film 66, an upper part wiring layer 67, a filter layer 68, an upper part substrate 69, and a polarization layer 70, in this order.

The polarization layer 61 transmits the light with specific polarization components. The polarization layer 70 also transmits the light with specific polarization components, similarly to in the polarization layer 61. It should be noted that a vibration direction of the light passing through the polarization layer 61, and a vibration direction of the light passing through the polarization layer 70 are in orthogonal relation.

The lower part substrate 62 is a plate-like member substantially transparent to the light of visible light region. The lower part substrate 62, together with the upper part wiring layer 67, holds mechanically from the lower part wiring layer 63 to the filter layer 68. The lower part substrate 62 is, for example, flat glass, or a plate-like resin, and a constitution material thereof is arbitrary (for example, glass, polycarbonate, an acrylic resin or the like). The configuration of the upper part wiring layer 67 is the same as the configuration of the above-described lower part substrate 62.

The lower part wiring layer 63 is installed with a plurality of TFT (Thin Film Transistor) elements as switching elements. In addition, the lower part wiring layer 63 is formed by a conductive thin film (ITO: Indium Tin Oxide). The lower part wiring layer 63, together with the upper part wiring layer 67, applies electric field onto the liquid crystal layer 65. An orientation state of the liquid crystal layer 65 is controlled by application of electric field. By control of the orientation state of the liquid crystal, transmission or non-transmission of light from a back light is controlled.

The oriented film 64 and the liquid crystal layer 65 are arranged so as to sandwich the liquid crystal layer 65. The oriented film 64 and the oriented film 66 arrange liquid crystal molecules in a predetermined direction. The oriented film 64 and the oriented film 66 are formed by an organic thin film of a polymer material such as polyimide. It should be noted that between the oriented film 64 and the oriented film 66, a spacer 71 is arranged in order to make layer thickness of the liquid crystal layer 65 constant.

The filter layer 68 has a filter of red, green and blue by each pixel. In addition, the filter layer 68 has, between pixels, a light shielding film to prevent generation of light cross-talk between pixels.

FIG. 2 shows a schematic configuration of a pixel region PX of the lower part wiring layer 63. As shown in FIG. 2, at the pixel region PX of the lower part wiring layer 63, a transmission part 72 and a reflection part 73 are installed. In addition, at the boundary part of the pixel region PX, a wiring part 74 is arranged. It should be noted that the TFT element is not illustrated here. The light emitted from the back light unit 50 reaches the liquid crystal layer 65 via the transmission part 72. The reflection part 73 around the transmission part 72 reflects the incident light entering from the top surface of the liquid crystal panel part 60. By installment of the reflection part 73, the light coming from outside can be utilized as a light source of the liquid crystal display apparatus. It should be noted that, as shown in FIG. 1, position of a light emission region R1 of the back light unit 50 corresponds to position of the transmission part 72 of the lower part wiring layer 63.

Then, explanation will be given on a laminated structure of the back light unit 50 with reference to FIG. 3.

As shown in FIG. 3, the back light unit 50 has a support substrate 1, a lower part electrode layer 2, an insulation layer 3, an organic EL layer 4, an upper part electrode layer 5, and a lens array substrate 6, in this order.

The support substrate 1 is a plate-like member made of metal with predetermined thickness. The support substrate 1 supports mechanically the lower part electrode layer 2, the insulation layer 3, the organic EL layer 4, the upper part electrode layer 5 and the lens array substrate 6, which were arranged on the top surface of substrate.

The lower part electrode layer 2 is formed on the top surface of the support substrate 1 by deposition of a metal material such as aluminum, based on usual thin film formation technology (vapor deposition or the like). The lower part electrode layer 2, along with the upper part electrode layer 5, is used in applying electric field to the organic EL layer.

The insulation layer 3 is formed on the lower part electrode layer 2, based on a general coating method (spin coating or the like). In addition, the insulation layer 3 is formed with a plurality of opening parts 9, based on utilization of lithography technology. It should be noted that a top view shape of the opening parts 9 is a quadrangle shape with a side of about 20 μm. In addition, an arrangement interval of the opening parts 9 is substantially equal to an arrangement interval of the lens 8.

By forming the opening parts 9 at the insulation layer 3, the lower part electrode layer 2 is exposed in response to formation position of the opening parts 9. And, the lower part electrode layer 2 is subjected to surface contact with the organic EL layer 4, in a formation range of the organic EL layer 4 and the opening parts 9.

By applying voltage between the lower part electrode layer 2 and the upper part electrode layer 5, a carrier (positive hole, electron) can be injected to the organic EL layer 4 with limitation to a formation range of the opening parts 9. That is, the light emission parts R1 of the organic EL layer 4 corresponds to formation position of the opening parts 9, and is limited to the formation range of the opening parts 9. It should be noted that the insulation layer 3 is made of a general resist material (resin). The opening parts 9 is installed in response to focal point position of the lens (aspherical lens) 8.

The organic EL layer 4 is formed on the insulation layer 3, based on a vacuum vapor deposition method. The organic EL layer 4 is configured by three layers of laminated bodies (a positive hole transportation layer/an organic light emission layer/an electron injection layer). The positive hole transportation layer is a thin layer made of α-NPD (4,4'-bis[N-(1-naphthyl)-N-phenylamino]biphenyl with a thickness of 40 μm. The organic light emission layer is a thin layer made of a tris(8-quinolinolato) aluminum complex (hereafter Alq) with a thickness of 30 nm. The electron injection layer is a thin layer, where lithium (Li) is doped to Alq, with a thickness of about 30 nm.

The upper part electrode layer 5 is formed on the top surface of the organic EL layer 4 by deposition of an indium-tin oxide layer, based on usual thin film formation technology (vapor deposition or the like).

The lens array substrate 6 has a plurality of the lenses 8 at the top surface 7, arranged matrix-likely with predetermined space each other. The lens array substrate 6 is made by one-piece of a lens part and a substrate part. The substrate part of the lens array substrate 6 preferably has characteristics of shielding outside air. Therefore, it is made of a material not permeating oxygen or steam in air, or the surface of the substrate is preferably coated with a protecting film made of such a material.

The lens array substrate 6 is a member substantially transparent in a wavelength region of light generated in the organic EL layer 4. The lens array substrate 6 is molded, for example, by a 2P method, an injection molding method, a sol-gel method or a hot embossing method or the like.

Here, a mold is prepared by a machine cutting method, and a plurality of lenses 8 were formed by a 2P (Photo Polymer)

method, by using this mold, on a mirror polished glass substrate with a thickness of 150 μm. It should be noted that lens width is 140 μm, and distance between the lenses is about 150 μm. In this way, a plurality of the lenses 8 are arranged apart with predetermined interval.

In addition, the back light unit 50 is formed by adhering the lens array substrate 6 to a light source unit configured by the support substrate 1 through the lens array substrate 6. Accordingly, at the lens array substrate 6 and the above-described light source unit, an alignment mark for positioning of the opening parts 9 and the 8 are installed, respectively.

As shown in FIG. 3, the opening parts 9 and the transmission part 72 are installed on the optical axis of the lens 8. As described above, the opening parts 9 is installed in response to the focal point position of the lens 8. The lens 8 concentrates the light generated at the light emission parts R1 corresponding to formation range of the opening parts 9, to the transmission part 72.

Here, explanation will be given on relation between lens height and injection directivity from the back light unit with reference to FIG. 4. As shown in FIG. 4, increase in lens height also varies the directivity of light emitted from the back light unit. Specifically, directivity is enhanced with increase in lens height up to a certain threshold value, and when the lens height is over a certain threshold value, directivity is deteriorated with increase in lens height. This threshold value is lens height when focal point position of the lens coincides with the light emission parts R1. Accordingly, in the present embodiment, height of the lens 8 is set so that focal point position of the lens 8 substantially coincides with the light emission parts R1.

As shown in FIG. 5, the lens 8 is an aspherical lens. In addition, as shown in FIG. 6, the lens 8 has the inner side lens face 10 containing the optical axis AX, and the outer side lens face 11 enclosing the inner side lens face 10. And, curvature in the outer side lens face 11 is smaller than curvature in the inner side lens face 10.

In this way, the light passing through the lens face of the lens 8 is more efficiently concentrated at the transmission part 72 (refer to FIG. 3). And, generation of light loss after passing through the lens face is suppressed, and even in a semi-transmissive liquid crystal display apparatus incorporated with a back light unit, which utilizes an organic EL, light utilization efficiency thereof can be enhanced.

It should be noted that the inner side lens face 10 and the outer side lens face 11 are divided by a division line DL1, only for explanation convenience. That is, a setting region of the inner side lens face 10 may be any part of the lens face of the lens 8. The situation is similar also for the outer side lens face 11.

It should be noted that a cross-sectional view shape of the lens 8 of FIG. 5 can be represented by the following expression (1). Therefore, the lens 8 satisfying this expression can exert the above action effect.

(Expression (1))

$$z = \frac{cr^2}{1 + \sqrt{1 - (1+k)c^2r^2}} \quad (1)$$

where k represents constant in a range of −1.4<k<0;
z represents height of a lens face at an arbitrary point;
c represents curvature of a lens at the vicinity of the apex; and
r represents coordinate at an arbitrary point.

Explanation will be given on effect in the case where the back light unit 50 relevant to the present embodiment is applied to a semi-transmissive liquid crystal display apparatus. It should be noted that the case where a spherical lens with a cross-sectional view shape as shown in FIG. 7, is adopted as a comparative embodiment. According to evaluation result by the present inventors, the back light unit 50 relevant to the present embodiment provided 1.6 times brightness as compared with the comparative embodiment. In other words, light utilization efficiency of the semi-transmissive liquid crystal display apparatus was able to be increased by 1.6 times.

Finally, explanation will be given on a method for producing the back light unit 50 with reference to FIGS. 8A to 8E.

Figure 8A:
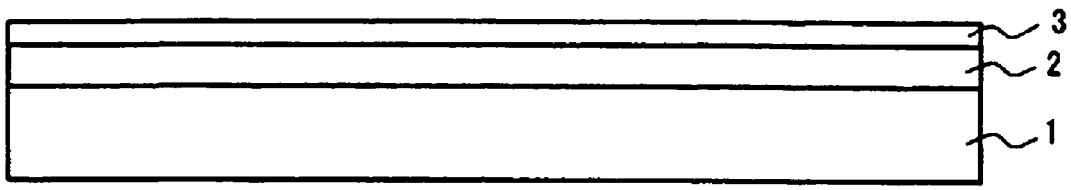
FIGS. 8A to 8E are charts for explaining a method for producing a back light unit.

As shown in FIG. 8A, first of all, the lower part electrode layer 2, the organic EL layer 4, and the upper part electrode layer 5 are formed on the support substrate 1, in this order. As described above, a metal material such as aluminum is deposited on the top surface of the support substrate 1, based on usual thin film formation technology (vapor deposition or the like) to form the lower part electrode layer 2. After that, the insulation layer 3 is formed on the lower part electrode layer 2, based on a general coating method (spin coating or the like).

Figure 8B:
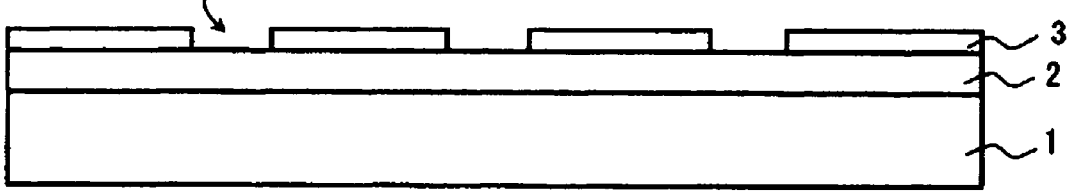

Then, as shown in FIG. 8B, a plurality of the opening parts 9 are formed at the insulation layer 3, based on utilization of lithography technology. That is, by partially removing an exposure part of the insulation layer 3 by UV (Ultraviolet) exposure, development treatment via a photo-mask, a plurality of the opening parts 9 arranged matrix likely are formed at the insulation layer 3. It should be noted that, as described above, the insulation layer 3 is a resist layer made of a resist material. In addition, characteristics (positive-type, negative-type) of the resist material should be determined depending on lithography condition.

Figure 8C:
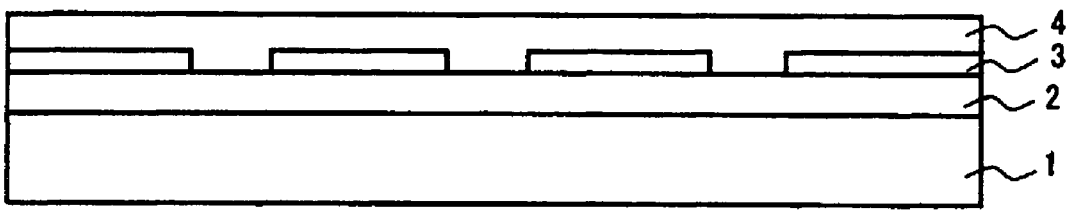

Then, as shown in FIG. 8C, the organic EL layer 4 is formed on the insulation layer 3, based on a vapor deposition method. That is, αNPD is deposited in about 40 nm to form the positive hole transportation layer. Then, a tris(8-quinolinolato) aluminum complex (Alq) is deposited in about 30 nm to form the organic light emission later. After that, a thin film, where lithium (Li) is doped to Alq, is deposited in about 30 nm to form the electron injection layer.

Figure 8D:
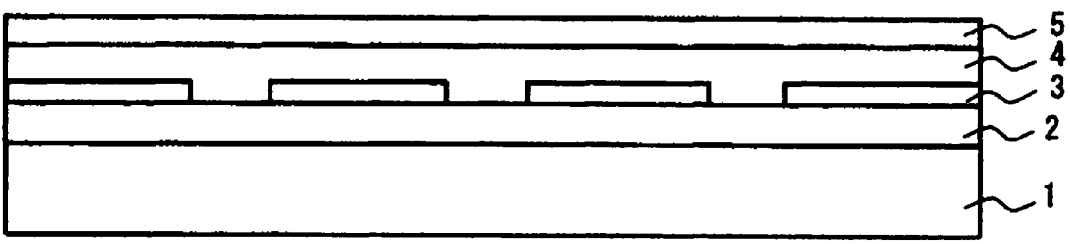
Figure 8E:
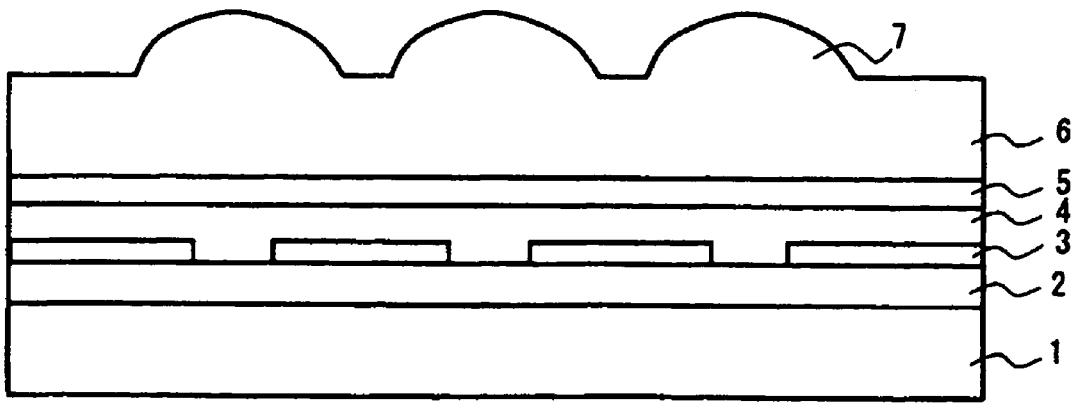

Then, as shown in FIG. 8D, the upper part electrode layer 5 is formed on the top surface of the organic EL layer 4 by deposition of an indium-tin oxide layer, based on usual thin film formation technology (vapor deposition or the like).

After that, the lens array substrate 6 is adhered to a light source unit configured by the support substrate 1 through the upper part electrode layer 5. In this case, an alignment mark formed in advance at the lens array substrate 6 and an alignment mark formed in advance at the above-described light source unit are made coincident. In this way, positioning of the lens 8 is determined relative to the opening parts 9.

In the present embodiment, as described above, the lens 8 is an aspherical lens, and curvature in the outer side lens face 11 of the lens 8 is smaller than curvature in the inner side lens face 10 of the lens 8. In this way, light passing through the lens face of the lens 8 is more efficiently concentrated at the transmission part 72. In addition, generation of light loss after passing through the lens face is suppressed, and even in a semi-transmissive liquid crystal display apparatus incorporated with a back light unit, which utilizes the organic EL, light utilization efficiency thereof can be enhanced.

It should be noted that, in the back light unit 50 relevant to the present embodiment, thickness thereof can also be decreased down to about 1 mm or thinner. This point is particularly advantageous effect in a semi-transmissive liquid crystal display apparatus to be incorporated in small size apparatus such as a mobile phone.

Second Embodiment

Explanation will be given below on a second embodiment of the present invention with reference to FIG. 9 to FIG. 13F.

Figure 9:
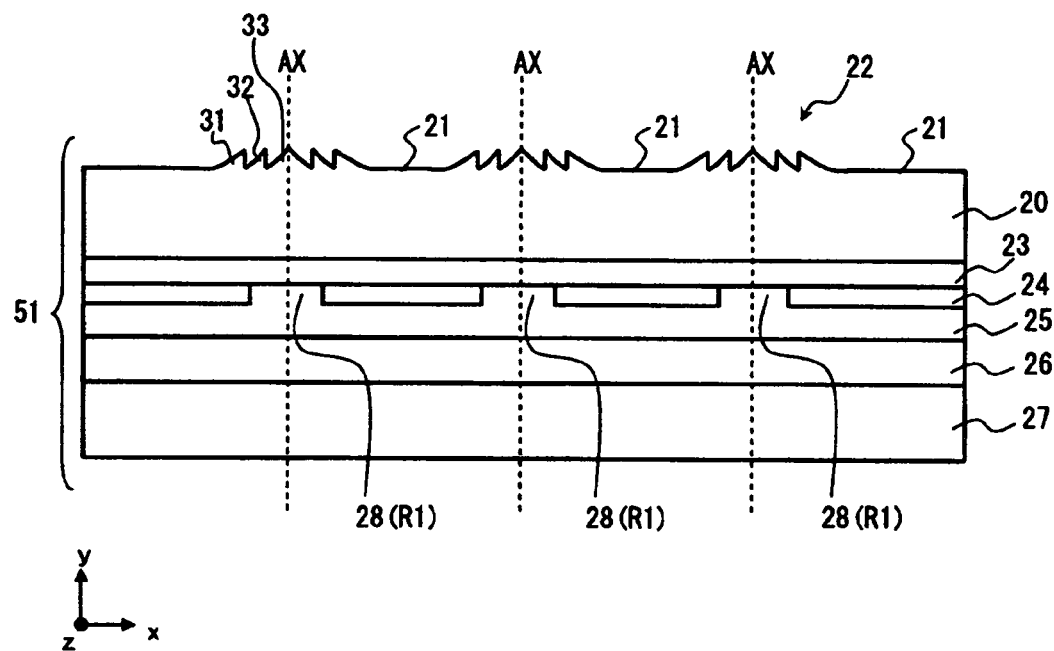
FIG. 9 is a schematic exemplary diagram for explaining a laminated structure of a back light unit.
Figure 10:
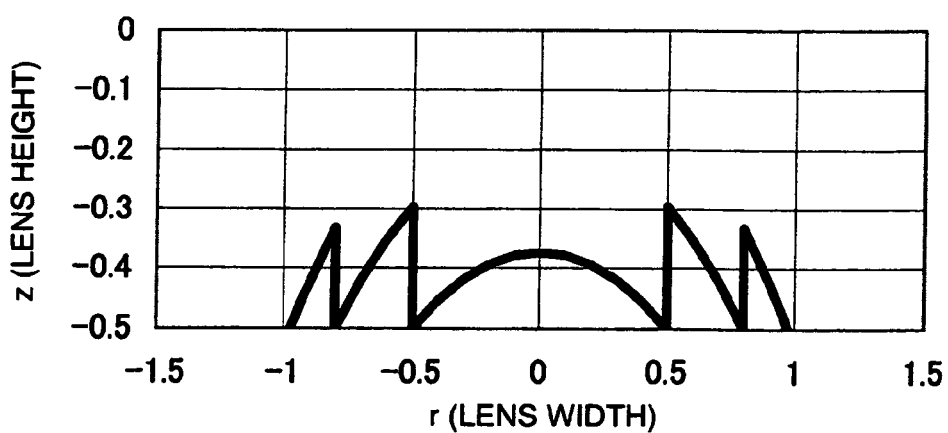
FIG. 10 is a schematic diagram for explaining a lens configuration (a cross-sectional view shape).
Figure 11:
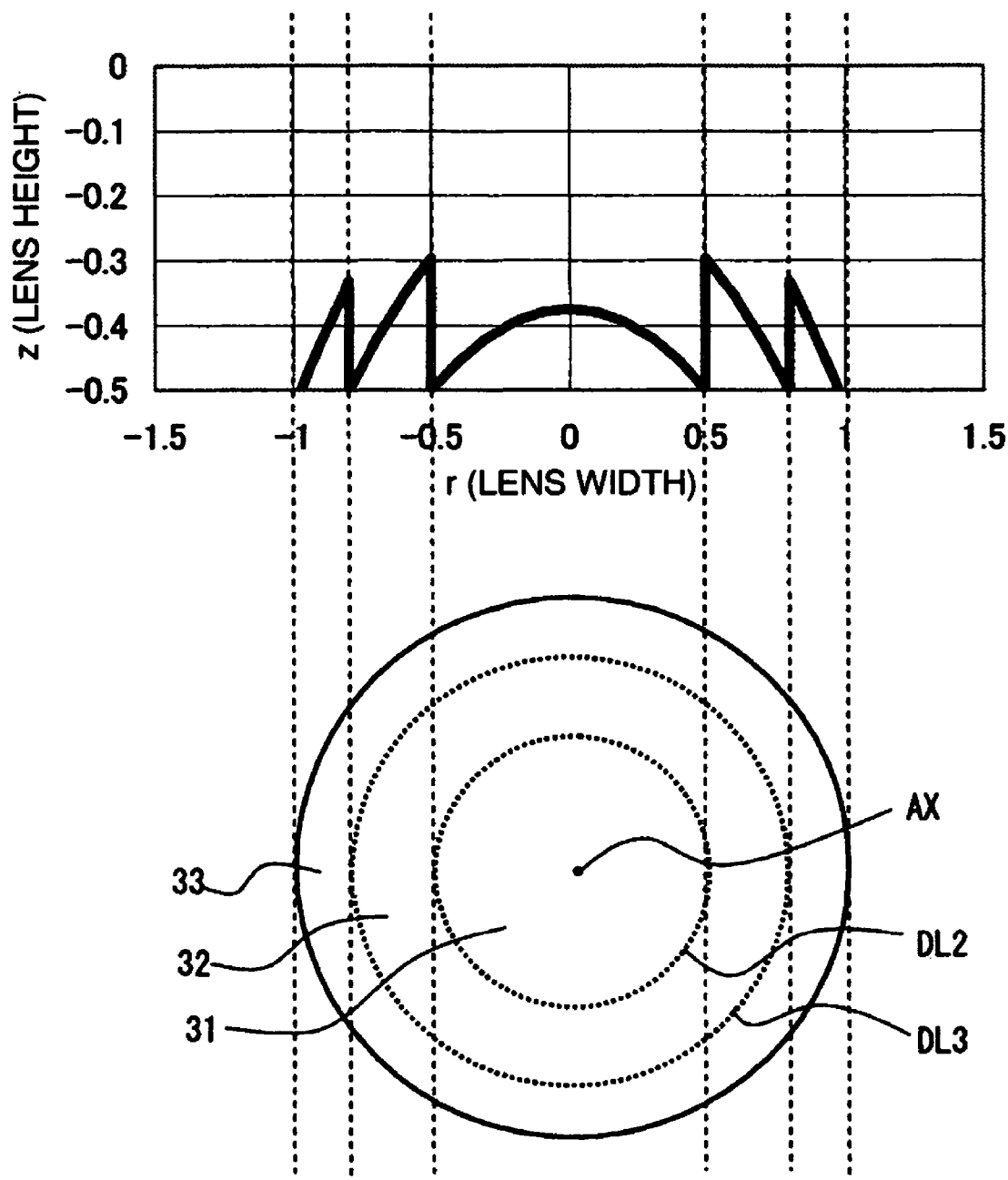
FIG. 11 is a schematic diagram for explaining a lens configuration (a cross-sectional view shape, a top view shape).
Figure 12A:
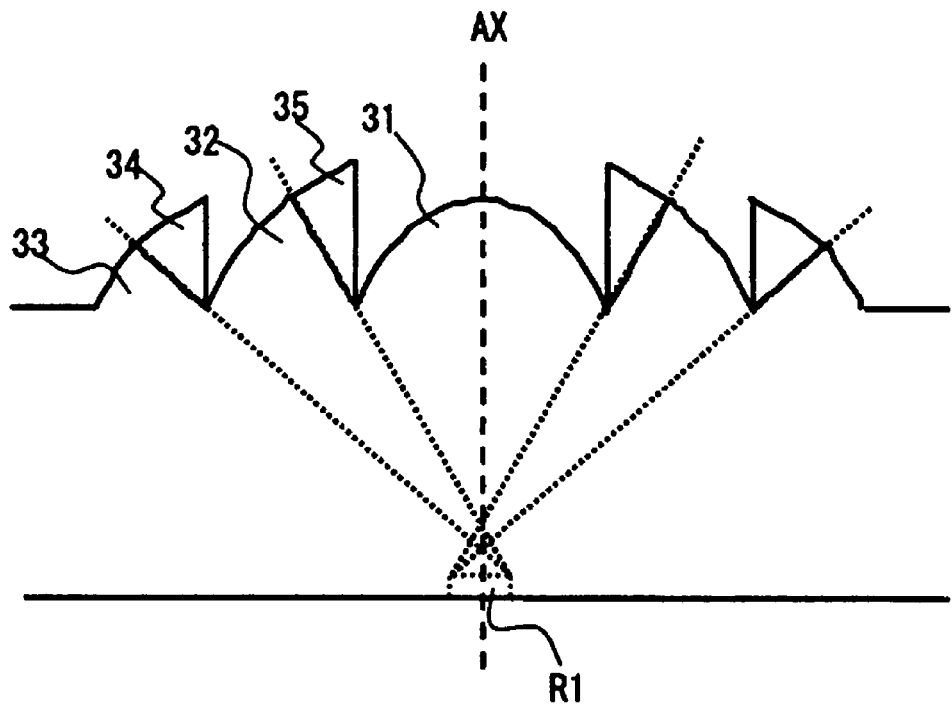
FIGS. 12A and 12B are schematic exemplary diagrams for explaining variation of a lens configuration (a cross-sectional view shape).
Figure 12B:
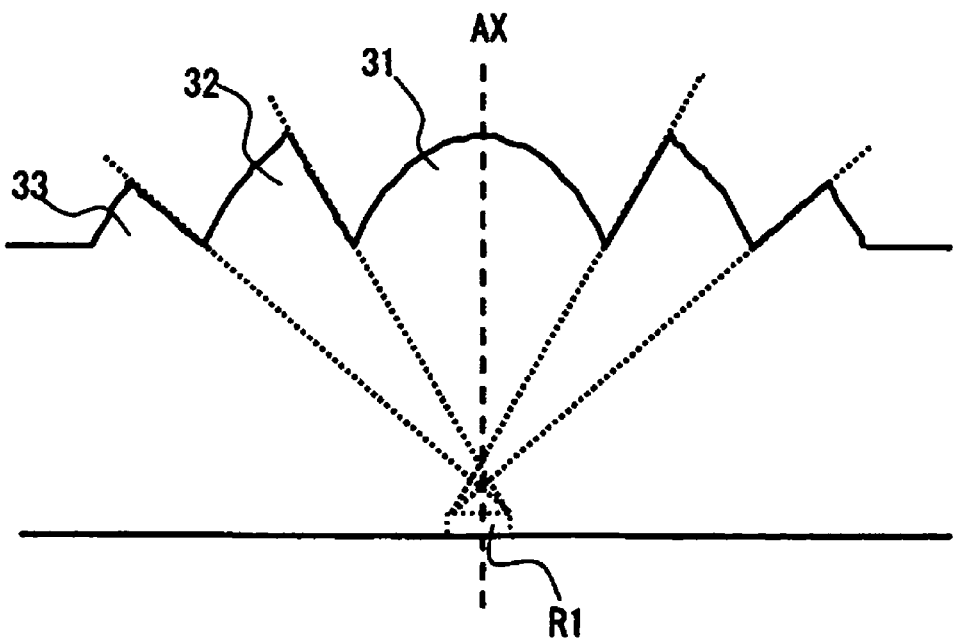

FIG. 9 is a schematic exemplary diagram for explaining a laminated structure of a back light unit. FIG. 10 is a schematic diagram for explaining a lens configuration (a cross-sectional view shape). FIG. 11 is a schematic diagram for explaining a lens configuration (a cross-sectional view shape, a top view shape). FIGS. 12A and 12B are schematic exemplary diagrams for explaining variation of a lens configuration (a cross-sectional view shape). FIGS. 13A to 13F are charts for explaining a method for producing a back light unit.

The back light unit 51 relevant to the present embodiment adopts a lens 22, as shown in FIG. 10. In this way, in addition to the effect explained in the first embodiment, height of the lens itself, which controls directivity of outgoing light, can be set low. In other words, by setting thickness of the lens itself thin, still more thinning of the back light unit 51 can be achieved. Explanation will be given below in more specifically.

As shown in FIG. 9 to FIG. 11, the lens 22 is divided to three by division lines resembling to a top-view shape (circle-like) of the lens 22. That is, as shown in FIG. 11, the lens 22 is divided to a circle-like body 31, a ring-like body 32 and a ring-like body 33, by division lines DL2 and Dl3.

The circle-like body 31 is a part where a cross-sectional view shape positioned at the center of the lens 22 is a convex shape, and has a lens face intersecting with the photo axis AX. The ring-like body 32 is a part enclosing the 31. The ring-like body 33 is a part enclosing the 31 as well as the ring-like body 32.

As shown in FIG. 10, curvature in the circle-like body 31 becomes smaller from the center toward the exterior side. Curvatures of the ring-like body 32 and the ring-like body 33 are also similar. In this way, in addition to the effect similar to the first embodiment, due to division of the lens 22, thickness of the lens 22 can be made thin, and thinning of the back light unit 51 can be achieved. It should be noted that the division line here resembles to a contour shape of the lens 22. Number of the division lines, that is, division number of the lens 22 is arbitrary.

Here, explanation will be given on a laminated structure of the back light unit 51 with reference to FIG. 9. It should be noted that because function of the back light unit 51 is similar to that of the back light unit 50 relevant to the first embodiment, redundant explanation is omitted.

As shown in FIG. 9, the back light unit 51 has, in the order from the top, a lens array substrate 20, an upper part electrode layer 23, an insulation layer 24, an organic EL layer 25, a lower part electrode layer 26 and an insulation layer 27.

The lens array substrate 20, similarly to in the first embodiment, has a plurality of the lenses 22 at the top surface 21, arranged matrix-likely with predetermined space each other. The lens array substrate 6 is made one-piece of a lens part and a substrate part.

The lens array substrate 20 is molded, for example, by a 2P method, an injection molding method, a sol-gel method or a hot embossing method or the like. A cross-sectional view shape of the lens 22 is set based on data shown in FIG. 10. Lens width of the lens 22 is 140 μm, and distance between the lenses is 150 μm. A structure of the lens 22 is as described above.

The upper part electrode layer 23 is formed at the bottom surface of the lens array substrate 20, by deposition of an indium-tin oxide layer in a thickness of 30 μm.

The insulation layer 24 is formed on the upper part electrode layer 23, by coating a positive-type photoresist, based on a general coating method (for example, a spin coating).

It should be noted that the insulation layer 24 is formed with a plurality of opening parts 28 in response to position of the lens 22, by utilization of lithography technology.

The organic EL layer 25 has a similar configuration as in the first embodiment, and is formed on the insulation layer 24, based on a vacuum vapor deposition method.

The lower part electrode layer 26 is formed on the organic EL layer 25, by deposition of aluminum in 50 nm.

The insulation layer 27 is formed on the lower part electrode layer 26, by deposition of silicon oxide in 200 nm. By deposition of the insulation layer 27, mechanical strength of the back light unit 51 is enhanced.

The back light unit 51 relevant to the present embodiment does not contain a supporting substrate, different from the back light unit 50. Therefore, thinning of the back light unit 51 can be achieved effectively.

Here, explanation will be given on variation of the lens 22 with reference to FIGS. 12A and 12B. As shown in FIG. 12A, parts specified by parts 34 and 35, at the upper side than a dotted line, do not exert lens action. Therefore, a cross-sectional view shape of the lens 22 may be a shape as shown in FIG. 12B. That is, the inner side surface of the ring-like body 32 is not required to be formed in perpendicular (parallel to the optical axis of the lens 22) to the top surface 7 of the lens array substrate as shown in FIG. 12A, and may be formed with inclination in a direction of the optical axis of the lens 22, to the top surface 7 of the lens array substrate, as shown in FIG. 12B. It should be noted that similar explanation to in the ring-like body 32 is held to the inside surface of the ring-like body 33.

By configuring the lens array substrate 20 as shown in FIG. 12B, it becomes relatively easier to take out a molded member from a mold, as compared with the case of FIG. 12A, and the lens array substrate 20 can be produced simpler.

Finally, explanation will be given on a method for producing the back light unit 51 with reference to FIGS. 13A to 13F.

Figure 13A:
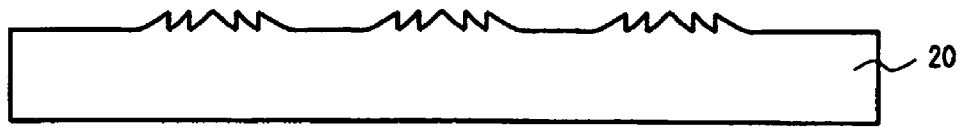
FIGS. 13A to 13F are charts for explaining a method for producing a back light unit.

As shown in FIG. 13A, the lens array substrate 20 is prepared first.

Figure 13B:

Then, as shown in FIG. 13B, the upper part electrode layer 23 is formed on one surface (a surface opposing to a lens formation surface) of the lens array substrate 20, by deposition of an indium-tin oxide layer in a thickness of 30 μm. In addition, the insulation layer 24 is formed on the upper part electrode layer 23, by coating a positive-type photoresist, based on a general coating method (for example, a spin coating).

Figure 13C:
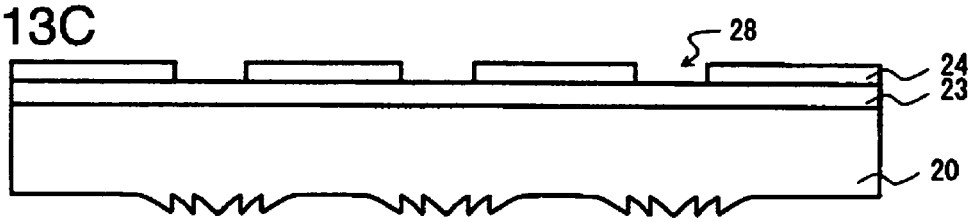

Then, as shown in FIG. 13C, a plurality of opening parts 28 in response to position of the lens 22 are formed at the insulation layer 24, by utilization of lithography technology.

Figure 13D:
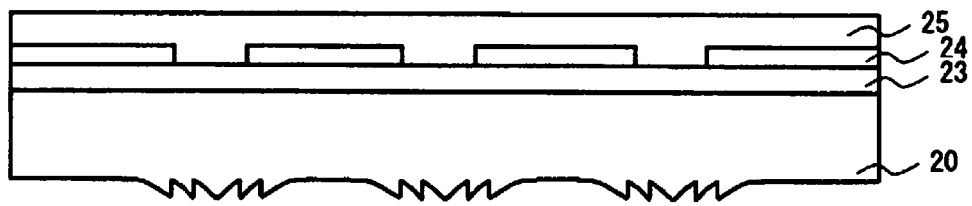

Then, as shown in FIG. 13D, the organic EL layer 25 is formed on the insulation layer 24, based on a vacuum vapor deposition method.

Figure 13E:
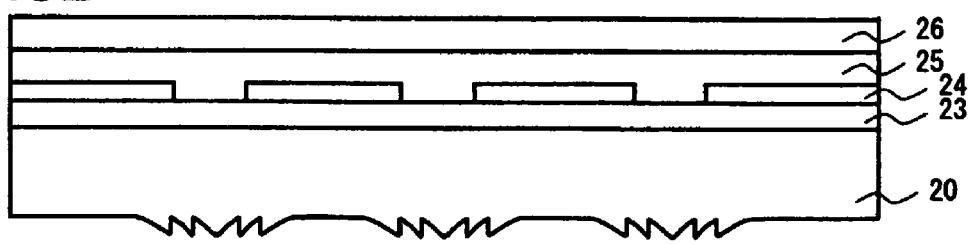

Then, as shown in FIG. 13E, the lower part electrode layer 26 is formed on the organic EL layer 25, by deposition of aluminum in 50 nm.

Figure 13F:
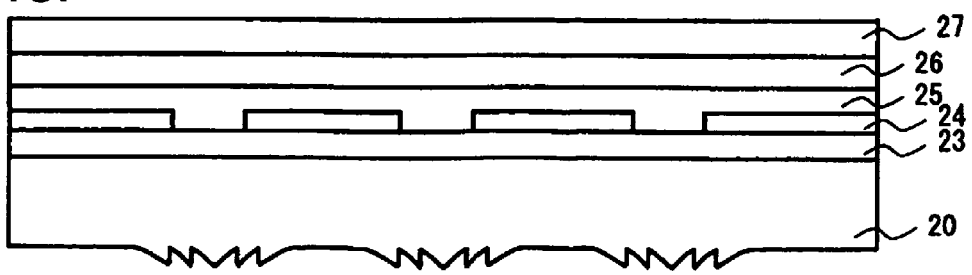

Then, as shown in FIG. 13F, the insulation layer 27 is formed on the lower part electrode layer 26, by deposition of silicon oxide in 200 nm.

In the present embodiment, in addition to the point that similar effect can be obtained as explained in the first embodiment, thickness of the back light unit 51 can be decreased still more. This effect is capable of providing a back light unit suitable to a semi-transmissive liquid crystal display apparatus to be mounted to a small size apparatus such as a mobile phone.

Technological scope of the present invention should not be limited to the above explanation. A specific shape of a lens arranged at the top surface of the lens array substrate is not limited to the shape of the above-described embodiment. A lenticular-type lens may be adopted also. A top view shape of the lens is not limited to a circular shape, and for example, may be a square-shape. A laminated structure of the back light unit is not limited to one in the above-described embodiment. In the lens array substrate, a substrate part and a lens part are not required to be formed one-piece, and a lens sheet may be adhered to the supporting substrate.

A configuration and a production method of each layer configuring the back light unit are arbitrary. The lens array substrate may be prepared by a method other than a 2P method. For example, the lens array substrate may be prepared by using an injection molding method, a hot embossing method or the like. It is preferable to use a resin such as polycarbonate, acrylic resin, or glass, for a constitution material of the lens array substrate. The lens array substrate may be prepared, for example, by a sol-gel method, by using an inorganic compound or an organic compound.

It should be noted that the lens array substrate may be configured by an organic resin such as polycarbonate, acrylic resin, however, in this case, it is preferable to form a barrier layer at least at one surface of the lens array substrate in order to furnish barrier property (resistance to outside air) to the lens array substrate.

It is because to achieve longer life of the back light unit, it is required to suppress the corrosion of the organic EL layer, electrode or the like contained in the electroluminescence element, caused by oxygen or steam in air. For example, it is preferable that for the lens array substrate obtained by injection molding of polycarbonate, silicon dioxide or the like is formed by sputtering, at the opposite surface of lens formation surface thereof, and this may be used as the lens array substrate. It should be noted that a lens shape and substrate thickness of the lens array substrate are arbitrary.

A laminated structure of the organic EL layer may be one laminated with a positive hole injection layer/a positive hole transportation layer/an organic light emission layer/an electron transportation layer/an electron injection layer, in this order. In addition, the electroluminescence layer exemplified by the organic EL layer, may be one made of an inorganic material (for example, ZnS). In addition, the electroluminescence layer may be formed by utilization of a wet-type method, a printing method, a transfer method or the like, other than a vacuum deposition method. An electrode material may be any one as long as having excellent electric conductivity, and other material may be adopted as well. As a method for formation of the electrode, a film formation method such as a sputtering method, an ion plating method may be utilized other than a vacuum vapor deposition method. In addition, setting range of light emission region is arbitrary.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An illumination apparatus for a liquid crystal display apparatus having a plurality of transmission parts arranged two-dimensionally, comprising:

a plurality of aspherical lenses, which is installed in response to each of a plurality of said transmission parts and concentrates light for each of a plurality of said transmission parts;

a plurality of light emission parts installed in response to each focal point position of a plurality of said aspherical lenses; and an electroluminescence layer containing a non-light emission region installed between a plurality of said light emission parts themselves, wherein each of a plurality of said aspherical lenses has an inner side lens face containing an intersection with an optical axis of said aspherical lenses, and an outer side lens face enclosing said inner side lens face, and curvature in said outer side lens face is smaller than curvature in said inner side lens face;

characterized in that each of a plurality of said aspherical lenses is divided to a circular body having said intersection at a lens face, and a ring-like body enclosing said circular body, based on a division line in response to a top view shape of said aspherical lens.

2. The illumination apparatus according to claim 1, characterized in that said outer side lens face is contained at least in a lens face of said ring-like body.

3. The illumination apparatus according to claim 1, characterized in that said outer side lens face is contained at least in a lens face of said circular body.

4. The illumination apparatus according to claim 1, characterized in that said outer side lens face is contained in a lens face of said circular body, as well as also in a lens face of said ring-like body.

5. The illumination apparatus according to claim 1, characterized in that a cross-sectional view shape of said circular body is a convex shape, and a cross-sectional view shape of said ring-like body is a convex shape.

6. The illumination apparatus according to claim 1, characterized in that the cross-sectional view shape of said aspherical lens is represented by the expression 1:

$$z = \frac{cr^2}{1 + \sqrt{1 - (1+k)c^2r^2}} \quad \text{(Expression 1)}$$

wherein k represents constant in a range of $-1.4 \leq k \leq 0$;

z represents height of a lens face at an arbitrary point;

c represents curvature of a lens at the vicinity of the apex; and r represents coordinate at an arbitrary point.

7. A liquid crystal display apparatus comprising:

a liquid crystal layer sandwiched between a pair of transparent substrates;

a wiring layer having a plurality of transmission parts arranged two-dimensionally; and an illumination apparatus emitting the incident light entered to said liquid crystal layer via said transmission part, wherein said illumination apparatus comprising:

a plurality of aspherical lenses, which is installed in response to each of a plurality of said transmission parts and concentrates the light for each of a plurality of said transmission parts;

a plurality of light emission parts installed in response to each focal point position of a plurality of said aspherical lenses; and an electroluminescence layer containing a non-light emission region installed between a plurality of said light emission parts themselves, wherein each of a plurality of said aspherical lenses has an inner side lens face containing an intersection with an optical axis of said aspherical lenses, and an outer side lens face enclosing said inner side lens face, and curvature in said outer side lens face is smaller than curvature in said inner side lens face;

characterized in that each of a plurality of said aspherical lenses is divided to a circular body having said intersection at a lens face, and a ring-like body enclosing said circular body, based on a division line resembling to a top view shape of said aspherical lens.

* * * * *